United States Patent [19]

Wakabayashi et al.

[11] Patent Number: 5,592,255
[45] Date of Patent: Jan. 7, 1997

[54] COMPACT CAMERA HAVING COMPONENTS INCLUDING INHIBITING CIRCUIT MOUNTED ON ONE MOUNTING BOARD

[75] Inventors: Hiroshi Wakabayashi, Yokohama; Hidenori Miyamoto, Urayasu, both of Japan

[73] Assignee: Nikon Corporation, Japan

[21] Appl. No.: 475,434

[22] Filed: Jun. 7, 1995

Related U.S. Application Data

[62] Division of Ser. No. 295,069, Aug. 26, 1994, abandoned, which is a continuation of Ser. No. 116,972, Sep. 7, 1993, abandoned.

[30] Foreign Application Priority Data

Sep. 4, 1992 [JP] Japan .................................. 4-260638
Sep. 4, 1992 [JP] Japan .................................. 4-260639

[51] Int. Cl.$^6$ .............................. G03B 7/08; G03B 13/36; G03B 17/00
[52] U.S. Cl. .......................... 396/89; 396/106; 396/301; 396/542; 396/535
[58] Field of Search .................................. 354/484, 403, 354/288, 412, 485

[56] References Cited

U.S. PATENT DOCUMENTS

| | | | |
|---|---|---|---|
| 2,378,406 | 6/1945 | Harris | 354/212 |
| 4,297,018 | 10/1981 | Murakami et al. | 354/456 |
| 4,579,439 | 4/1986 | Takahata et al. | 354/484 X |
| 4,607,931 | 8/1986 | Aihara | 354/484 X |
| 4,975,721 | 12/1990 | Tominaga et al. | 354/484 X |
| 5,117,251 | 5/1992 | Ishimura et al. | 354/484 X |
| 5,253,010 | 10/1993 | Oku et al. | 354/485 |
| 5,258,800 | 11/1993 | Seki et al. | 354/402 |

Primary Examiner—W. B. Perkey
Attorney, Agent, or Firm—Staas & Halsey

[57] ABSTRACT

A compact camera including a plurality of components and one mounting board having an upper surface and a lower surface and disposed inside the compact camera, near a top portion of the compact camera. The compact camera further includes a control circuit, mounted on the upper surface of the one mounting board, to control an operation of the plurality of components, a land portion disposed underneath at least one input device and mounted on the upper surface of the one mounting board, an IC element mounted on the lower surface of the one mounting board, a low power device disposed near the at least one input device and mounted on the lower surface of the one mounting board, and an inhibiting circuit mounted on the upper surface of the one mounting device, to inhibit an operation of the low power device when the at least one input device receives an operation input signal.

3 Claims, 4 Drawing Sheets

COMPACT CAMERA HAVING COMPONENTS INCLUDING INHIBITING CIRCUIT MOUNTED ON ONE MOUNTING BOARD

This application is a division of application Ser. No. 08/295,069, filed Aug. 26, 1994, now abandoned, which is a continuation of application Ser. No. 08/116,972, filed Sep. 7, 1993, now abandoned.

BACKGROUND OF THE INVENTION

1. Field of the Invention

The present invention relates to an internal structure of a compact camera, and more particularly, to mounting positions of various electronic components on one mounting board within the compact camera.

2. Description of the Related Art

Conventional compact cameras are designed to include a variety of electronic components, mounted very closely within the camera. The camera size is reduced due to the high-density of components located within a small area. Typical elements in a camera include a photographic lens barrel, a film cartridge chamber, a film windup spool chamber, a viewfinder device, a photometric device, an autofocus device, motor drive devices, a display device, and strobes.

A plurality of mounting boards, such as flexible printed wiring boards, have been used to interconnect all of the electrical components within the camera body. For example, the LCD display device, providing a display of information to the exterior of the camera, and the motor drive device, using an IC for performing motor drive control, are not conventionally mounted on a single board. The LCD is presently mounted on the rear cover of the camera body, while the motor drive IC is presently mounted on the front surface of the spool chamber. Using many mounting boards, however, results in an inefficient use of space, a relatively "large" compact camera, and higher manufacturing costs.

In addition, certain components inside the compact camera operate with low power, and are therefore highly influenced by electrical noise. For example, autofocus devices (hereinafter "AF" devices) and autoexposure devices (hereinafter "AE" devices) are controlled by a very low current. The electrical noise, generated either inside or outside of the camera, adversely affects the accuracy of the low-power devices.

In order to reduce the effects of noise on the AF device, for example, a signal processing circuit (i.e., an IC) is mounted as close as possible to the AF receiving unit. If, however, the signal processing circuit cannot be mounted adjacent to the AF receiving unit, the circuit must be carefully shielded. In a relatively larger camera, there is generally no problem with mounting the circuit close to the AF receiving unit, or providing a shield around the circuit.

In compact cameras, however, it is difficult to maintain the same design as in larger cameras. For example, there is no space available to mount the circuit close to the AF receiving unit due to the smaller size of the camera body. Moreover, if the signal processing circuit were to be mounted at a distant place, there still is not enough space to provide the necessary shielding for the circuit. Because the length of the electrical connections between the AF receiving unit and circuit is relatively large in a compact camera, it is more susceptible to noise. Low-power devices in conventional miniaturized cameras do not, therefore, function accurately.

A camera typically includes operating switches, such as a switch to change over the Speedlight flash photography mode. In compact cameras, the switches are located in close proximity to the signal processing circuit of the AF device. The operating switches themselves generate electrical noise when operated. The operator also generates electrical noise which is received by the AF device. Noise from the switches and the operator cause the AF device to function erroneously.

SUMMARY OF THE INVENTION

It is therefore an object of the present invention to provide an even smaller compact camera, which more efficiently utilizes the limited space within the compact camera body.

It is a further object of the present invention to provide a compact camera which may be manufactured at a relatively low cost.

Another object of the present invention is to provide a compact camera which efficiently interconnects all of the electronic components.

Yet another object of the present invention is to provide a compact camera which includes only one mounting board with which to efficiently mount and interconnect the electronic components.

Another object of the present invention is to provide a compact camera in which the electronic components are efficiently positioned in a high-density area within the camera body.

Still another object of the present invention is to provide a compact camera having low-power devices which are not adversely affected by electrical noise.

Yet a further object of the present invention is to provide a compact camera which includes an electronic device to prevent electrical noise from affecting low-power devices within the camera.

A further object of the present invention is to provide a compact camera which includes an control unit to prevent noise from operation input devices positioned near low-power devices from affecting the low-power devices.

The above objects are achieved by providing a compact camera which includes one mounting board, having an upper surface and a lower surface, and disposed inside the compact camera, near a top portion of the compact camera. A display panel is mounted on the upper surface of the mounting board. A control unit for controlling the operation of each device in the camera is also mounted on the upper surface of the mounting board. Furthermore, input devices and a land portion disposed underneath the input devices are mounted on the upper surface of the mounting board. A motor drive IC is mounted on the lower surface of the mounting board, and an autofocus IC is mounted on the lower surface of the mounting board.

In the compact camera having the structure described above, a low-power device is further mounted on the lower surface of the mounting board. Since the camera is compact in size, the low-power device is positioned close to the input devices. In order to prevent the low-power device from being affected by noise produced by the input devices, the compact camera also includes an inhibiting circuit which inhibits an operation of the low-power device when the input devices receive operation input signals.

BRIEF DESCRIPTION OF THE DRAWINGS

These and other objects and advantages of the invention will become apparent and more readily appreciated from the following description of the preferred embodiments, taken in conjunction with the accompanying drawings, of which.

DETAILED DESCRIPTION OF THE PREFERRED EMBODIMENTS

Figure 1:
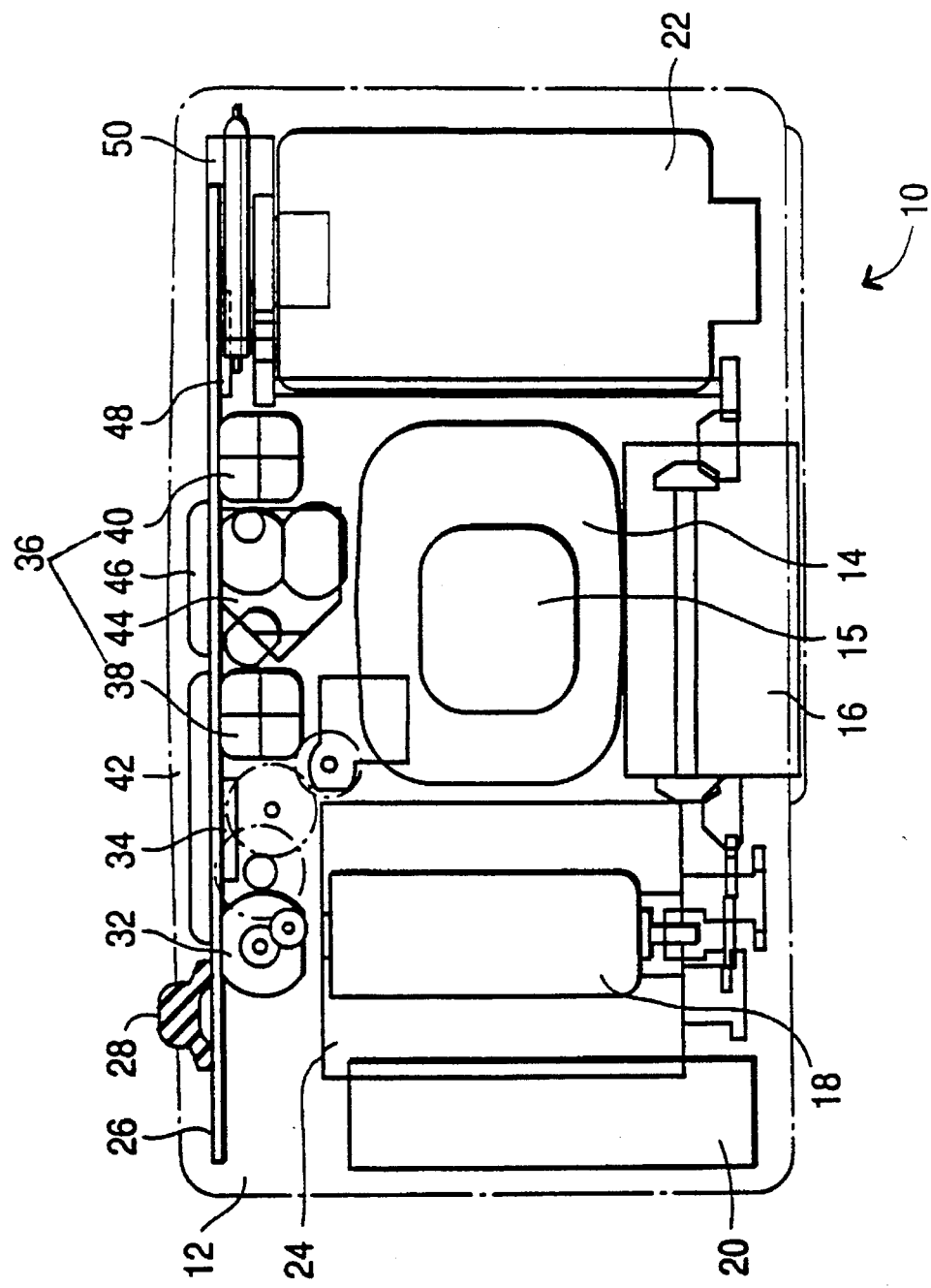
FIG. 1 is a cross-sectional, schematic, frontal view of a compact camera in accordance with a first embodiment of the present invention.

As shown in FIG. 1, a preferred embodiment of the compact camera, in accordance with the present invention, is designated generally by the reference character 10. The compact camera 10 includes a camera body 12. Camera body 12 includes a lens barrel 14, an electric power supply battery 16, an electric motor for forwarding film 18, a capacitor for strobe light generation 20, a film cartridge chamber 22, and a film windup spool chamber 24. The camera body 12 also includes rigid mounting board 26, to which many electrical components are mounted.

Figure 2A:
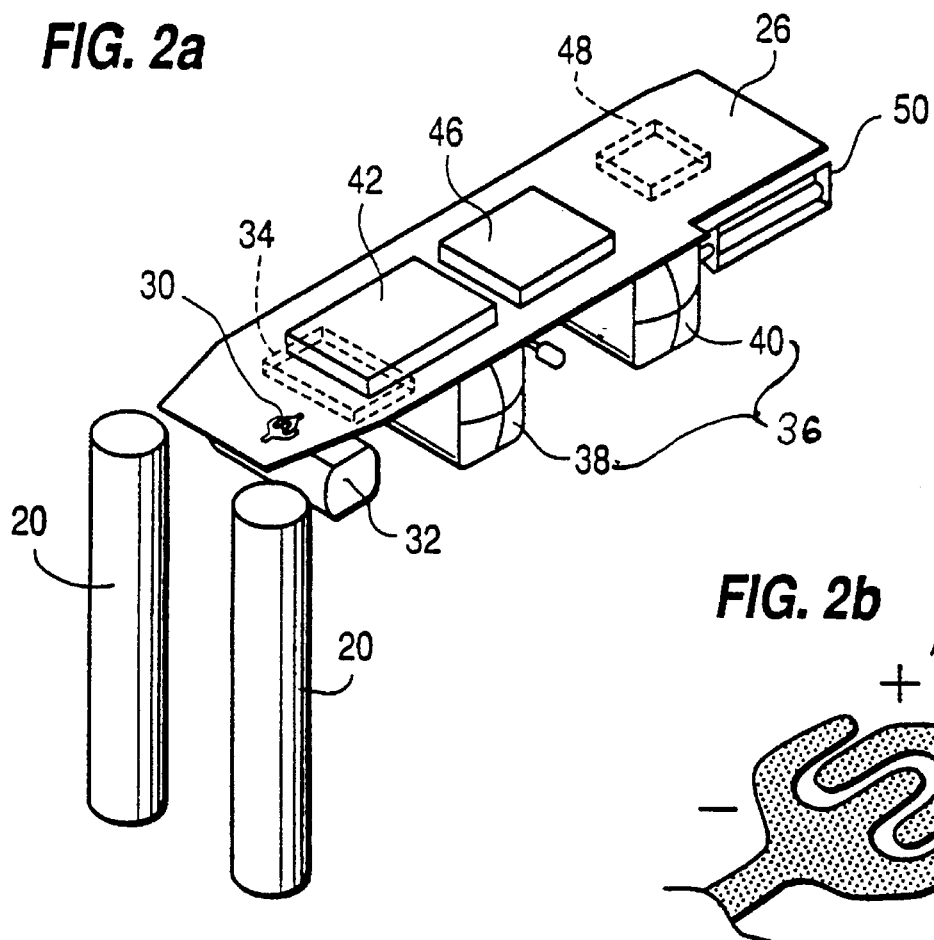
FIG. 2a and FIG. 2b are schematic perspective views of components attached to a mounting board in the compact camera according to the first embodiment of the present invention.
Figure 2B:
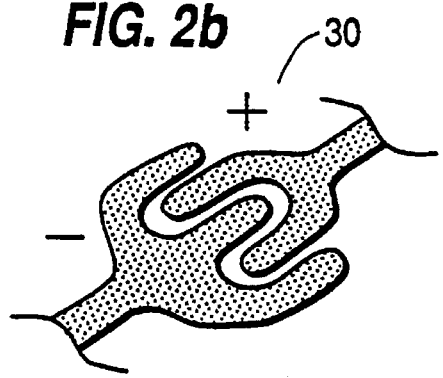

Attached to rigid mounting board 26 is a release button 28 and its land portion 30 (shown in FIGS. 2a and 2b). Elements 28 and 30, together, form a switch. Also attached to mounting board 26 are an electric motor 32 for driving lens barrel 14, a motor drive IC (integrated circuit) 34, an autofocus device 36, including a light projecting block 38 and a light receiving block 40, an LCD display panel 42, a viewfinder optical system 44, a CPU 46, an autofocus IC 48, and a strobe emitting unit 50.

Attached to the upper surface of the rigid mounting board 26 are release button 28, land portion 30, LCD display panel 42, and CPU 46. Attached to the lower surface of the rigid mounting board 26 are electric motor 32, motor drive IC 34, autofocus device 36, including light projecting block 38 and light receiving block 40, viewfinder optical system 44, autofocus IC 48, and strobe emitting unit 50.

Lens barrel 14 has a photographic lens optical system (not shown) in a center portion 15 of a front surface of lens barrel 14. An automatic exposure (AE) device (not shown) is arranged on an upper side of camera body 12. Film cartridge chamber 22 may be loaded with a film cartridge (not shown). Film windup spool chamber 24 winds up film delivered from the film cartridge. CPU 46 controls the operation of each camera component. LCD display panel 42 displays a variety of information, including the operating control state of photographic mode settings of the camera, the number of film exposures, etc. Electric motor 18 includes a motor drive device (not shown) to move the film between chamber 22 and chamber 24. Other electrical elements (not shown) may be connected to the CPU 46 and/or the LCD display 42, and mounted on mounting board 26.

The mounting board 26 is located on an internal wall surface on the upper side of camera body 12. Located on the lower side of camera body 12 are the film windup spool chamber 24, capacitor 20, electric motor 18, electric power supply battery 16, lens barrel 14, and film cartridge chamber 22. FIG. 1 illustrates that film windup spool chamber 24 is located to the right of capacitor 20. Electric motor 18 is also located to the right of capacitor 20. Between the spool chamber 24 and film cartridge chamber 22 are both the battery 16 and lens barrel 14. The battery 16 rests on the lower most side of camera body 12, with lens barrel 14 above it. Capacitor 20 is located parallel to, and laterally of, spool chamber 24.

Release button 28 projects from the top side of the camera body 12. Release switch land portion 30 is formed beneath the release button 28, which is illustrated in FIGS. 2a and 2b. Furthermore, an additional land portion, (not shown) corresponding to other external input operating switches (see FIGS. 3 and 4), is also arranged on the upper surface of mounting board 26. The other operating switches are located correspondingly to the additional land portion on the upper surface of mounting board 26.

The viewfinder optical system 44 is located on the lower surface of the mounting board 26 and between lens barrel 14 and mounting board 26. On the left side of optical system 44 is light projecting block 38, and on the right side of optical system 44 is light receiving block 40. Lens barrel electric motor 32, on the lower surface of mounting board 26, is located upward of the spool chamber 24. Film forwarding electric motor 18 is within a windup shaft of spool chamber 24. IC 34 is located on the lower surface of the mounting board 26, upward of the spool chamber 24, and between light projecting block 38 and electric motor 32. IC 48 is located on the lower surface of mounting board 26, upward of film cartridge chamber 22, and positioned rearward of the strobe emitting unit 50, between strobe unit 50 and light receiving block 40. The position of light projecting block 38 and light receiving block 40 may be interchanged.

While this layout represents an efficient, high-density mounting arrangement, providing a compact and light camera, this particular arrangement may be suitably modified. Furthermore, the form and structure of the internal components may be suitably altered. For example, mounting board 26 may be a rigid-type printed circuit board, loaded with the LCD 42 and the CPU 46.

FIG. 2a shows land portion 30, LCD display panel 42, and CPU 46 mounted on the upper surface of mounting board 26. Land portion 30 is made from a conductive material. FIG. 2b, which shows a blown-up view of land portion 30, illustrates a configuration of the conductive land portion. The conductive land portion 30 contacts a depressed release button 28, thereby forming a switch. Motor 32, IC 34, light blocks 38 and 40, IC 48 and strobe 50 are on the lower surface of mounting board 26.

Figure 3:
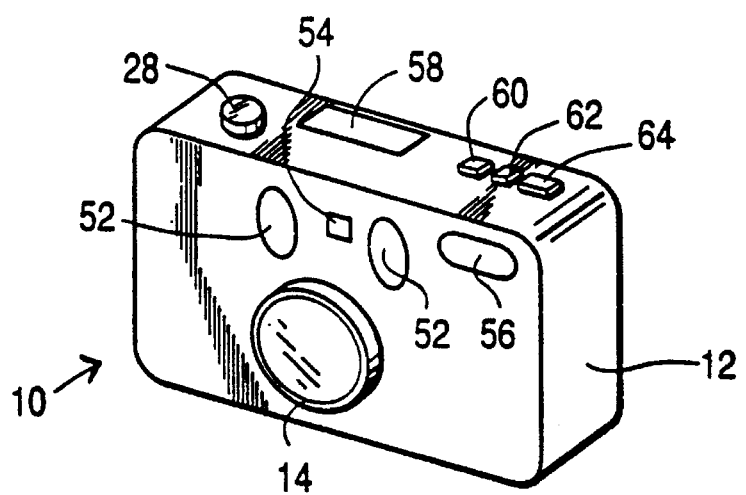
FIG. 3 is a perspective view of a compact camera in accordance with a second embodiment of the present invention.

As shown in FIG. 3, a second embodiment of the compact camera, in accordance with the present invention, is designated generally by the reference character 10. Since this embodiment is similar to that of FIG. 1, like reference numerals represent like elements.

Reference numeral 12 corresponds to the camera body, 14 is a photographic lens barrel located in the central portion of the camera body 12, 52 represents AF (autofocus) ranging windows located in the central portion of the front surface of camera body 12, and above lens barrel 14, 54 is the viewfinder window, and 56 is the Speedlight emitting portion. Furthermore, 58 is a LCD display window which displays each type of camera operation and photographic information. It is arranged in the center of the top portion of camera body 12. 28 is the release button, disposed toward one side of the top of the camera body 12.

60 is a first function button, 62 is a second function button, and 64 is an electric power switch. These three buttons are arranged in a row on the top of the camera body 12, toward an opposite side of release button 28. These three buttons are operating buttons which set various operating modes of the camera, as well as providing other functional operations.

The first function button 60 may be used, for example, for setting the Speedlight photography mode. It may be depressed a number of times to indicate various modes of Speedlight emission, including ON and OFF. The particular mode set is displayed through the LCD display window 58. The second button 62 may be used, for example, for setting a self-timer mode. It, too, is depressed a number of times to indicate various modes, including one self-timer shot, two successive self-timer shots and an OFF mode. The particular mode set is displayed through the LCD display window 58. Furthermore, the electric power switch 64, when set ON, places the camera 10 in a usable state.

Figure 4:
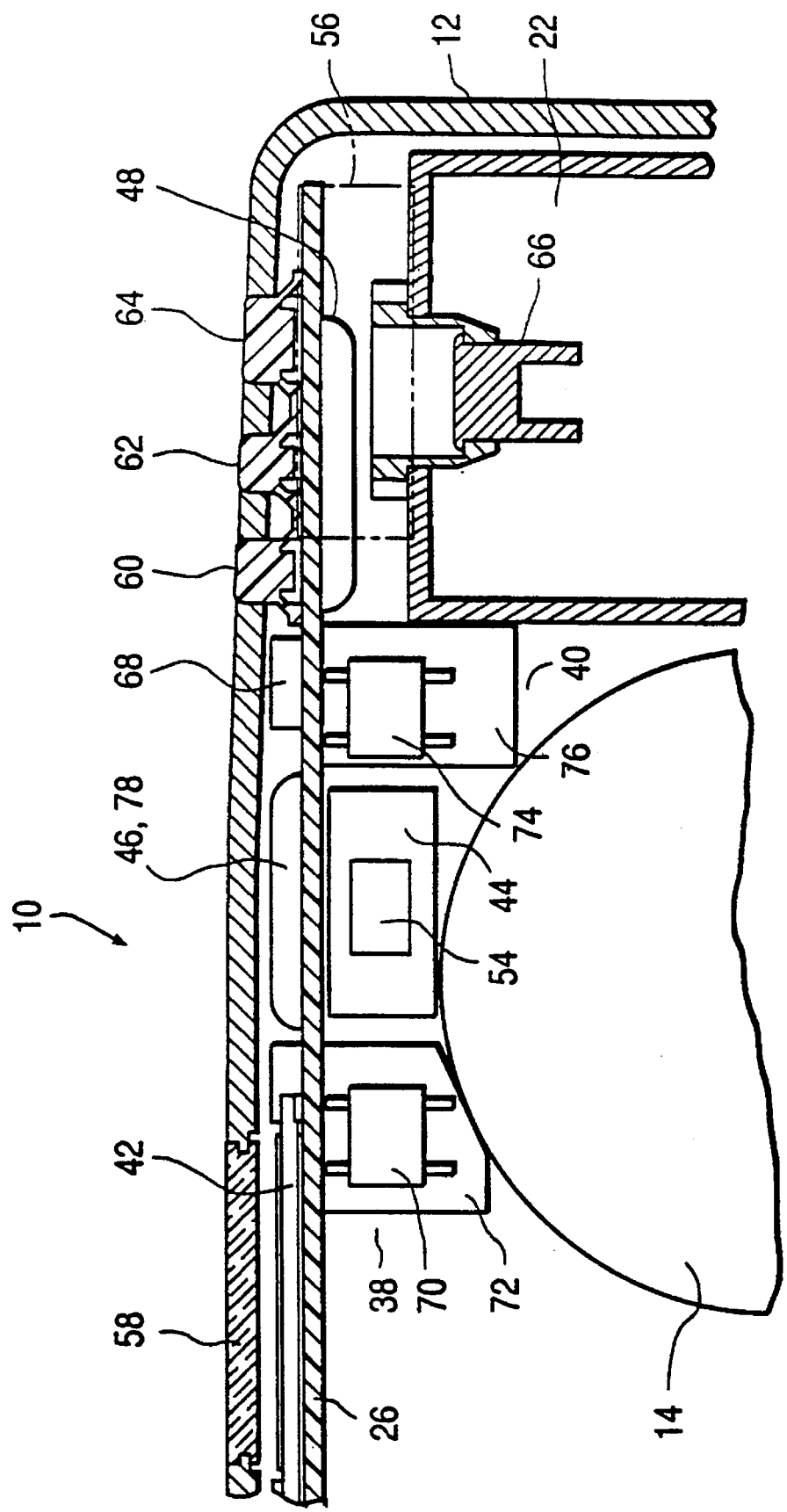
FIG. 4 is a cross-sectional, schematic, frontal view of the compact camera according to the second embodiment of the present invention.

FIG. 4 illustrates the structure of an upper part of one side portion of camera body 12, according to the second embodiment, which includes the portion having the first and second function buttons 60 and 62, and the power switch 64. 22 represents a cartridge chamber which receives a film cartridge (not shown) and is located on one side of camera body 12 (corresponding to the right-hand side of the drawing). 66 is a film rewinding shaft, which faces the interior of cartridge chamber 22.

26 is a rigid mounting board, such as a printed circuit board, for example. It is located along the internal wall surface of the top side of camera body 12. CPU 46 and LCD display panel 42 are mounted on the board 26. CPU 46 controls the operation of each component in the camera 10. LCD 42 is a display panel which displays various types of information, including the operating control state of each portion of the camera, the photographic mode which has been set, the number of photographs, etc. 68 represents an additional circuit element. Furthermore, a land portion (shown in FIG. 2) for use in switching ON and OFF, by means of the operation of the first and second function buttons 60 and 62, and the power switch 64, is formed beneath the switches. The land portion is a conductive portion on the board. The LCD 42 is arranged in a position such that it can be observed from the exterior through the LCD display window 58 in the top portion of camera body 12.

The light projecting block 38 includes an infrared light emitting element (IRED) 70 for use in AF ranging and printed board 72 on which light emitting element 70 is mounted. The IRED 70 is included in AF device 36 (shown in FIG. 1). The AF device functions with very low electric power. Furthermore, light receiving block 40 includes a light receiving unit (PSD) 74 for use in AF ranging and printed board 76 on which light receiving unit 74 is mounted. Light receiving unit 74 is included in the AF device 36. Light emitting unit 70 and light receiving unit 74 are located in correspondence with AF ranging windows 52 on the front side of camera body 12, as illustrated in FIG. 3.

Light receiving unit 74, for use in AF ranging, works on a very low current supply. Therefore, it is highly influenced by electrical noise. In larger cameras, an IC 48 for AF use is mounted on printed board 76, on which light receiving unit 74 is also mounted. Their close proximity significantly reduces the various affects of electrical noise between the signal processing unit 48 and the light receiving unit 74. In the compact camera of the present invention, however, the viewfinder prism optical system 44 is positioned to correspond with viewfinder window 54, located between light emitting unit 70 and light receiving unit 74. There is no space available for mounting IC 48 on the same printed board 76 as light receiving unit 74. Noise from input buttons 60, 62 and 64 will, therefore, affect unit 74 and IC 48, because the electrical connections between unit 74 and IC 48 span a greater distance.

Light emitting unit 70 and light receiving unit 74, for use in AF ranging, are mounted on the lower surface of board 26. In addition, IC 48 for AF use, which includes a signal processing circuit for the AF device 36, is also mounted on the board 26, adjacent to light receiving unit 74. IC 48 is mounted on the lower surface of printed circuit board 26, corresponding to the function buttons 60 and 62 and electric power switch 64 located on the upper surface of board 26.

As stated above, light receiving unit 74 is a circuit functioning with very low electric power, and IC 48 is its signal processing circuit. In the compact camera of this embodiment of the invention, unit 74 and circuit 48 are mounted separately from each other, and connected through mounting board 26. Moreover, function buttons 60 and 62, and power switch 64 are devices receiving operation inputs from the exterior, and are positioned close to unit 74 and IC 48. When the power source switch 64 is operated, no noise problem exists, because the AF device 36 is not functioning. However, the AF device 36 is functioning during the operation of function buttons 60 and 62. In this case, the electrical noise will most likely be received by light receiving unit 74. Yet, in the compactly designed camera 10 of the preferred embodiment of the invention, there is no space available to provide shielding for IC 48.

Because function buttons 60 and 62, and power switch 64 are positioned very close to light receiving unit 74 and IC 48, a control circuit 78, within CPU 46 is designed to inhibit the AF device, i.e., unit 74 and IC 48, from functioning when function buttons 60 and 62 are operated. In other words, during the operation of function buttons 60 and 62, as operational input devices, the functions of AF devices IC 48 and light receiving unit 74 are inhibited. This eliminates the adverse affects of electrical noise accompanying the operation of the input devices 60 and 62. Furthermore, this design increases the number of positions for the IC signal processing circuit 48, and the operation input devices 60 and 62. For example, it becomes possible to place these devices close together, which is desirable in a compact camera.

Figure 5:
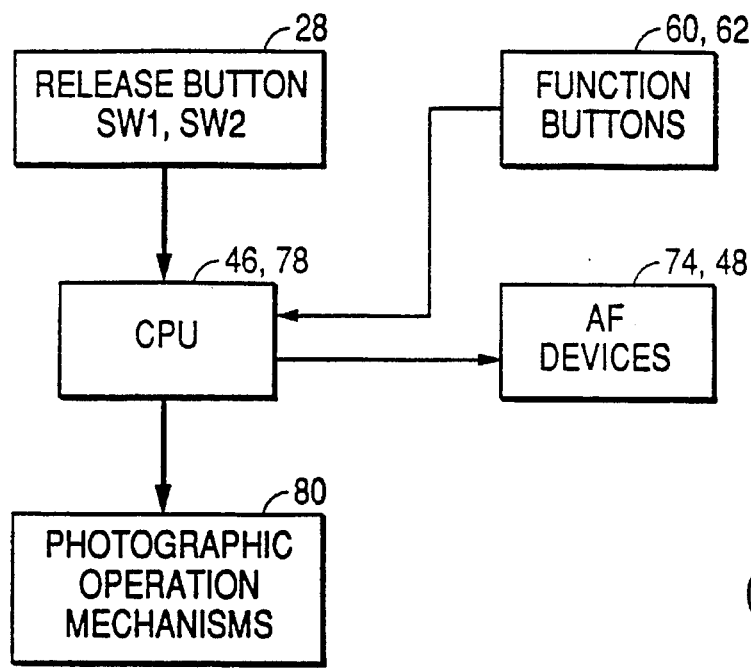
FIG. 5 is a block diagram illustrating the operation of the compact camera according to the second embodiment of the present invention.

FIG. 5 is a block diagram, where element 80 represents all the photographic operation mechanisms in camera 10, including the shutter mechanism, the film winding mechanism, etc. All of these mechanisms 80 are controlled to be driven into prescribed states by CPU 46. CPU 46 includes control circuit 78. Release button 28 (including switches SW1, SW2) is used to control CPU 46. When function buttons 60 and 62, however, are operated during a photographic operation, the function of low-power devices, such as AF devices 74 and 48, are suspended by control circuit 78.

Figure 6:
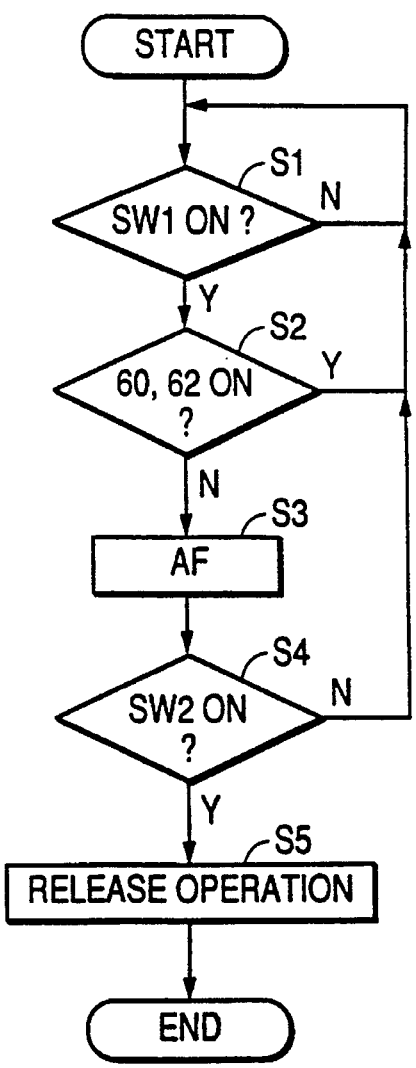
FIG. 6 is a flow-chart illustrating the operation of the compact camera according to the second embodiment of the present invention.

FIG. 6 is a flow chart of part of the operation of camera 10. Camera 10 is set for photographic operation at the START position. In step S1 the release button 28 is half pressed, corresponding to switch SW1, and it is confirmed that the switch SW1 has been set ON. If the SW1 is not set ON, release button 28 is half-pressed again in step S1. If SW1 is ON, step S2 occurs. In step S2, it is detected whether or not the function buttons 60 and 62 are in the ON state. When the modes switches 60 and 62 are in the OFF state, step S3 occurs. In step S3, the AF function is performed. However, when the mode switches are ON in step S2, the AF function, which is in a state likely to be influenced by electrical noise, is temporarily inhibited, and this routine is repeated starting at step S1. Furthermore, when the AF function ends in step S3, step S4 occurs. In step S4, the release button 28 is fully pressed, corresponding to switch SW2, and if SW2 is set ON, step S5 occurs. In step S5, the release operation is performed and normal photographic operation begins. If SW2 is not set ON in step S4, the routine is repeated, starting at step S1.

The second embodiment of the invention is not limited to the structure disclosed above. The form and structure of each portion of camera 10 can be suitably modified or altered. Further, the application of the second embodiment is not limited to AF devices, such as devices functioning with very low power, but can also be applied to photometric elements (i.e., AE devices) and the like, having very low current signal circuits. Also, the inhibiting control circuit, applied to a device using very low electric current, in an electronic instrument equipped with operation input function buttons, may be applied to various electric instruments, in addition to a compact camera.

Although the above preferred embodiments of the invention have been shown and described, it will be appreciated by those skilled in the art that changes may be made in these embodiments, without departing from the principles and the spirit of the invention, the scope of which is defined in the appended claims and their equivalents.

What is claimed is:

1. A compact camera including a plurality of components, comprising:

one mounting board having an upper surface and a lower surface and disposed inside said compact camera, near a top portion of said compact camera;

a control circuit, mounted on said upper surface of said one mounting board, to control an operation of said plurality of components;

a land portion disposed underneath at least one input device and mounted on said upper surface of said one mounting board;

an IC element mounted on said lower surface of said one mounting board;

a low power device disposed near said at least one input device and mounted on said lower surface of said one mounting board; and an inhibiting circuit mounted on said upper surface of said one mounting device, to inhibit an operation of said low power device when said at least one input device receives an operation input signal.

2. The compact camera according to claim 1, wherein said control circuit includes said inhibiting circuit.

3. The compact camera according to claim 1, wherein said low power device is an autofocus device.

\* \* \* \* \*